United States Patent
Lee et al.

(10) Patent No.: US 11,482,290 B2
(45) Date of Patent: Oct. 25, 2022

(54) CONTROLLER AND MEMORY SYSTEM INCLUDING THE CONTROLLER

(71) Applicant: SK hynix Inc., Icheon-si (KR)

(72) Inventors: Dong Uk Lee, Icheon-si (KR); Hae Chang Yang, Icheon-si (KR); Hun Wook Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/208,782

(22) Filed: Mar. 22, 2021

(65) Prior Publication Data

US 2022/0093194 A1  Mar. 24, 2022

(30) Foreign Application Priority Data

Sep. 22, 2020 (KR) .................. 10-2020-0122225

(51) Int. Cl.
  *G11C 16/34* (2006.01)
  *G11C 16/32* (2006.01)
  *G11C 16/26* (2006.01)
  *G11C 16/30* (2006.01)
  *G11C 16/10* (2006.01)

(52) U.S. Cl.
  CPC .......... *G11C 16/3459* (2013.01); *G11C 16/10* (2013.01); *G11C 16/26* (2013.01); *G11C 16/30* (2013.01); *G11C 16/32* (2013.01); *G11C 16/3404* (2013.01)

(58) Field of Classification Search
  CPC ..... G11C 16/3459; G11C 16/10; G11C 16/26; G11C 16/30; G11C 16/32; G11C 16/3404
  USPC ....................................... 365/185.22, 185.24
  See application file for complete search history.

(56) References Cited

U.S. PATENT DOCUMENTS

| 4,531,182 | A | * | 7/1985 | Hyatt ..................... G11C 11/565 700/2 |
| 5,414,829 | A | * | 5/1995 | Fandrich ................ G11C 16/32 713/502 |
| 5,774,733 | A | * | 6/1998 | Nolan ..................... H03M 1/56 713/300 |
| 10,541,042 | B2 | * | 1/2020 | Nelson ................ G06F 11/3664 |
| 2004/0003167 | A1 | * | 1/2004 | Kimura .................. G11C 16/26 711/103 |
| 2005/0002240 | A1 | * | 1/2005 | Hamaguchi ............ G11C 29/14 365/185.33 |

(Continued)

FOREIGN PATENT DOCUMENTS

| KR | 1020170052066 A | 5/2017 |
| KR | 1020170069756 A | 6/2017 |

*Primary Examiner* — Michael T Tran
(74) *Attorney, Agent, or Firm* — William Park & Associates Ltd.

(57) ABSTRACT

A controller including a test manager configured to output a program command for performing a program operation of a memory block and a suspend command for stopping the program operation, and a memory interface configured to transmit the program command to a memory device including the memory block, and transmit the suspend command to the memory device after a set time elapses. The test manager outputs a read command for reading memory cells included in the memory block, the memory interface calculates a count value by counting data output from the memory device in response to the read command, and the test manager generates status information on the memory block according to the count value.

24 Claims, 16 Drawing Sheets

(56) References Cited

U.S. PATENT DOCUMENTS

| | | | |
|---|---|---|---|
| 2005/0099857 A1* | 5/2005 | Yuan | G11C 7/1045 |
| | | | 365/200 |
| 2006/0052964 A1* | 3/2006 | Sugaya | G01R 31/31919 |
| | | | 702/117 |
| 2008/0013378 A1* | 1/2008 | Crippa | G11C 16/3454 |
| | | | 365/189.05 |
| 2017/0062039 A1* | 3/2017 | Ong | G11C 11/4093 |
| 2017/0168752 A1* | 6/2017 | Micheloni | G06F 3/0688 |
| 2017/0194053 A1* | 7/2017 | Micheloni | G11C 16/0483 |
| 2021/0027831 A1* | 1/2021 | Nam | G11C 11/4093 |
| 2021/0327532 A1* | 10/2021 | Kim | G11C 16/16 |
| 2022/0076754 A1* | 3/2022 | Choi | G11C 11/5628 |
| 2022/0101938 A1* | 3/2022 | Vigilante | G11C 16/0483 |

\* cited by examiner

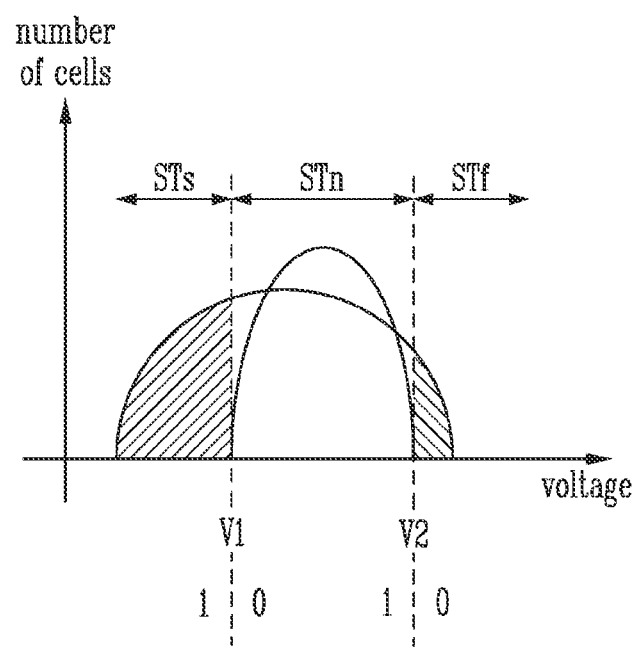

FIG. 15

| [ IND ] | [ Voltage ] | |
|---|---|---|
| IND_t1 | Vcd1 (V1) | |
| IND_t1_A1 | Vcd11 (V1−A1) | |
| IND_t1_A2 | Vcd12 (V1−A2) | V1sub |
| IND_t1_A3 | Vcd13 (V1−A3) | |
| IND_t2 | Vcd2 (V2) | |
| IND_t2_B1 | Vcd21 (V2+B1) | |
| IND_t2_B2 | Vcd22 (V2+B2) | V2sub |
| IND_t2_B3 | Vcd23 (V2+B3) | |

221

US 11,482,290 B2

CONTROLLER AND MEMORY SYSTEM INCLUDING THE CONTROLLER

CROSS-REFERENCE TO RELATED APPLICATION

The present application claims priority under 35 U.S.C. § 119(a) to Korean patent application number 10-2020-0122225, filed on Sep. 22, 2020, in the Korean Intellectual Property Office, the entire disclosure of which is incorporated herein by reference.

BACKGROUND

1. Technical Field

The present disclosure relates to a controller and a memory system including the controller, and more particularly, to a controller capable of testing a memory device and a memory system including the controller.

2. Related Art

A memory device may include a volatile memory device in which stored data is lost when power supply is interrupted, and a nonvolatile memory device in which stored data is maintained even though power supply is interrupted.

Among the volatile memory device and the nonvolatile memory device, the nonvolatile memory device is required to have a higher capacity and higher integration degree as usage of a portable electronic device such as a mobile phone and a notebook computer increases.

Therefore, integration degree improvement of a two-dimensional nonvolatile memory device that forms a memory cell as a single layer on a substrate reaches a limit, a three-dimensional nonvolatile memory device that vertically stacks memory cells on a substrate has been developed.

The three-dimensional nonvolatile memory device is advantageous for high integration, but since a distance between elements configuring the memory device is narrow, reliability of the memory device may be weak.

SUMMARY

A controller according to an embodiment of the present disclosure may include a test manager configured to output a program command for performing a program operation of a memory block and a suspend command for stopping the program operation, and a memory interface configured to transmit the program command to a memory device including the memory block, and transmit the suspend command to the memory device after a set time elapses. The test manager may be configured to output a read command for reading memory cells included in the memory block, the memory interface calculates a count value by counting data output from the memory device in response to the read command, and the test manager generates status information on the memory block according to the count value.

A controller according to an embodiment of the present disclosure may include a command generator configured to output a program command for performing a program operation of a memory block, a suspend command for stopping the program operation, a first read command for checking a slow status of the memory block, and a second read command for checking a fast status of the memory block, a command queue configured to sequentially transmit the program command, the suspend command, the first read command, and the second read command to a memory device including the memory block, a counter configured to receive first and second data output from the memory device in response to each of the first and second read commands, and output a count value by counting the number of different bits included in each of the first and second data, and a status determiner configured to determine a status of the memory block according to the count value and generate status information.

BRIEF DESCRIPTION OF THE DRAWINGS

FIG. 11 is a diagram illustrating a voltage table according to the first embodiment.

FIG. 12 is a diagram illustrating a method of checking a status of memory cells in a test operation according to the first embodiment.

FIG. 15 is a diagram illustrating a voltage table according to the second embodiment.

DETAILED DESCRIPTION

Specific structural or functional descriptions of embodiments according to the concepts which are disclosed in the present specification or application are illustrated only to describe the embodiments according to the concepts of the present disclosure. The embodiments according to the concepts of the present disclosure may be carried out in various forms and the descriptions are not limited to the embodiments described in the present specification or application.

An embodiment of the present disclosure provides a controller capable of detecting a defect of a memory device in advance, and a memory system including the controller.

The present technology may determine the status of the memory block according to the status of the memory cells, detect a bad block, and shorten a test time for detecting the bad block.

Figure 1:
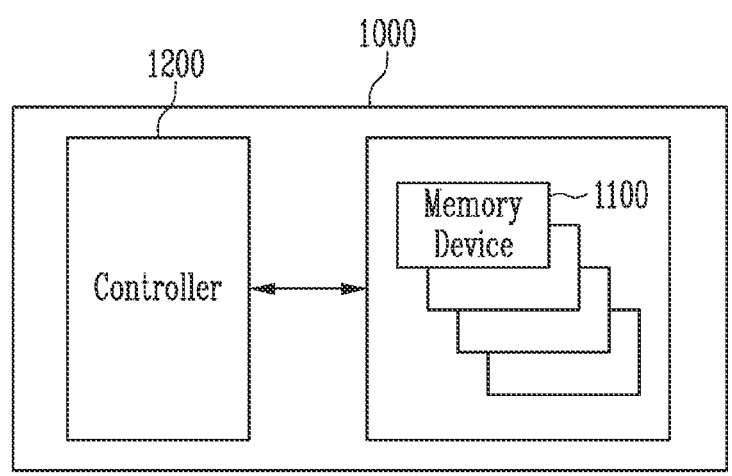
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 may include memory devices 1100 in which data is stored and a controller 1200.

The memory devices 1100 may be configured to store or output data according to control of the controller 1200. The memory devices 1100 may be connected to the controller 1200 through channels.

The controller 1200 may communicate between an external device and the memory devices 1100. The external device may be a host. The controller 1200 may control the memory devices 1100 according to a request of a host, or may perform a background operation for improving performance of the memory system 1000 even though a request of the host is not present.

The controller 1200 according to the present embodiment may be configured to test a defect of the memory devices 1100. For example, the controller 1200 may perform a test operation for checking whether memory blocks included in the memory devices 1100 are defective after the memory devices 1100 are manufactured. The controller 1200 may transmit a program command to memory blocks included in each of the memory devices 1100 and then transmit a suspend command after a predetermined time, and may check a status of the memory block based on a read result of programmed memory cells. For example, the controller 1200 may process the memory block as a bad block when a threshold voltage of the memory cells is excessively lower or higher than a reference, store status information with respect to a memory block of which the threshold voltage is slightly different from the reference, which is not the bad block, and manage a subsequent operation of the memory block by referring to the status information. The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 2:
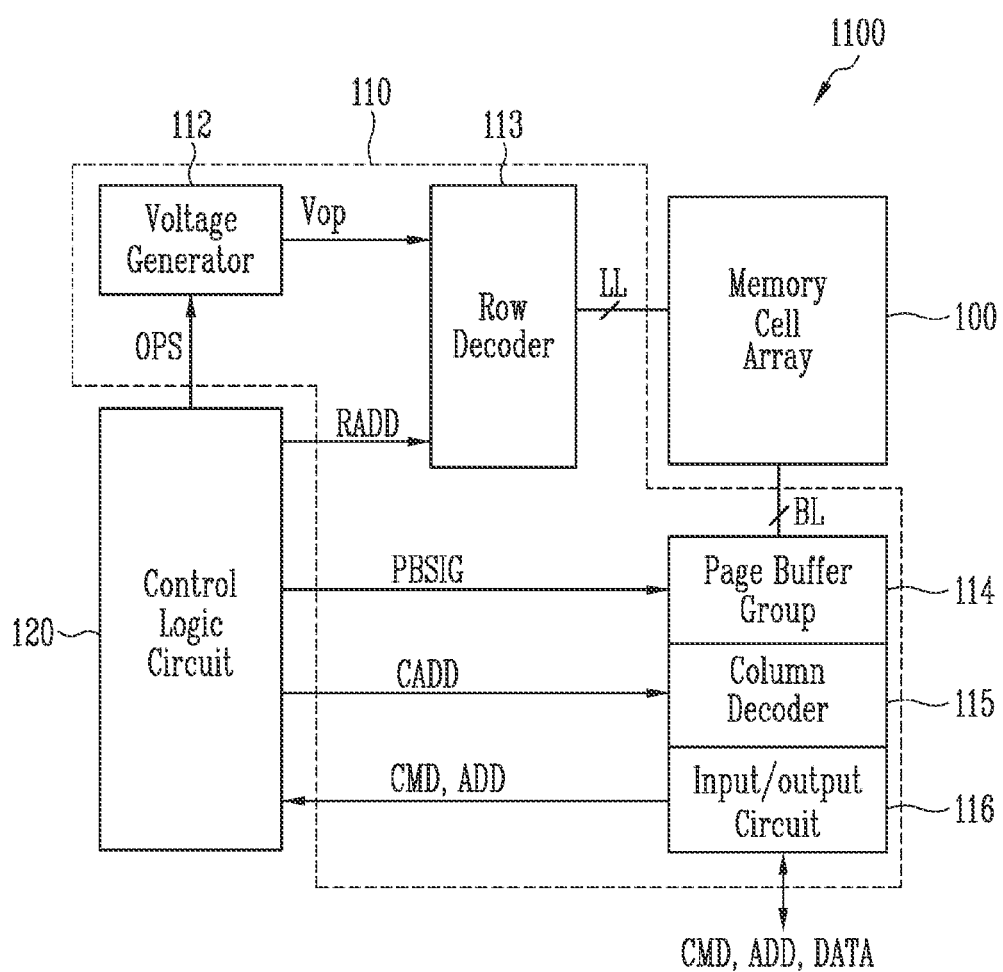
FIG. 2 is a diagram illustrating a memory device shown in FIG. 1.

FIG. 2 is a diagram illustrating the memory device shown in FIG. 1.

Referring to FIG. 2, the memory device 1100 may include a memory cell array 100 capable of storing data, and a peripheral circuit 110 capable of performing a program, read, or erase operation of the memory cell array 100.

The memory cell array 100 may include a plurality of memory blocks including nonvolatile memory cells. Local lines LL may be connected to each of the memory blocks, and bit lines BL may be commonly connected to each of the memory blocks.

The peripheral circuit 110 may include a voltage generator 112, a row decoder 113, a page buffer group 114, a column decoder 115, and an input/output circuit 116.

The voltage generator 112 may generate operation voltages Vop required for the program, read, or erase operation in response to an operation signal OPS, and transmit the generated operation voltage Vop to the row decoder 113. For example, the voltage generator 112 may generate and output operation voltages Vop such as a program voltage, a read voltage, an erase voltage, and a pass voltage.

The row decoder 113 may transfer the operation voltages Vop to a selected memory block through the local lines LL in response to a row address RADD.

The page buffer group 114 may include a plurality of page buffers connected to the bit lines BL. For example, the page buffer group 114 may store data by sensing a voltage or a current of the bit lines BL that are changed according to a threshold voltage of the selected memory cells. The page buffer group 114 may temporarily store data during the program or read operation in response to a page buffer control signal PBSIG.

The column decoder 115 may transmit data between the page buffer group 114 and the input/output circuit 116 in response to a column address CADD.

The input/output circuit 116 may receive a command CMD and an address ADD from an external device and transmit the command CMD and the address ADD to a control logic circuit 120. Here, the external device may be the controller 1200 of FIG. 1. The input/output circuit 116 may transmit data DATA received from the external device to the page buffer group 114 through the column decoder 115 during the program operation, and output the data DATA received from the column decoder 115 to the external device during the read operation.

The control logic circuit 120 may control the voltage generator 112, the row decoder 113, the page buffer group 114, the column decoder 115, and the input/output circuit 116 according to the command CMD and the address ADD. For example, the control logic circuit 120 may output the operation signal OPS and the page buffer control signal PBSIG in response to the command CMD, and may output the row address RADD and the column address CADD in response to the address ADD. The control logic circuit 120 may include software for executing various operations in response to the command CMD, and may include hardware for outputting signals required for various operations. According to the present embodiment, the control logic circuit 120 may perform the program operation in response to a program command, and may suspend the program operation in response to a suspend command. The control logic circuit 120 may terminate the suspended program operation in response to a termination command. In an embodiment, the memory device may include control logic that may be implemented as hardware, software, or a combination of hardware and software. For example, the control logic 120 may operate in accordance with an algorithm and/or a processor executing control logic code.

Figure 3:
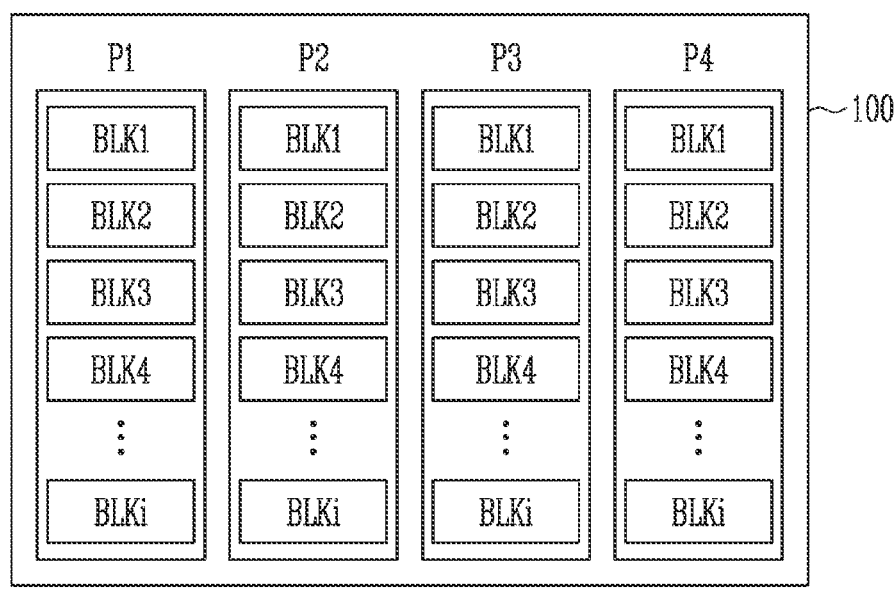
FIG. 3 is a diagram illustrating a memory cell array shown in FIG. 2.

FIG. 3 is a diagram illustrating the memory cell array shown in FIG. 2.

Referring to FIG. 3, the memory cell array 100 may be configured in a single plane or multi plane structure. The single plane structure is a structure in which the memory cell array 100 is configured of one plane, and the multi plane structure is a structure in which a plurality of planes are included in the memory cell array 100. FIG. 3 shows a memory cell array 100 having a multi plane structure as an embodiment.

The memory cell array 100 may include first to fourth planes P1 to P4. Different row decoders and different page buffer groups may be connected to the first to fourth planes P1 to P4. Each of the first to fourth planes P1 to P4 may include a plurality of memory blocks BLK1 to BLKi (i is a positive integer). Different physical addresses may be allocated to the first to fourth planes P1 to P4, and different physical addresses may also be allocated to the plurality of memory blocks BLK1 to BLKi. The first to i-th memory blocks BLK1 to BLKi may be configured identically to each other, and the i-th memory block BLKi among the first to i-th memory blocks BLK1 to BLKi is specifically described as follows.

Figure 4:
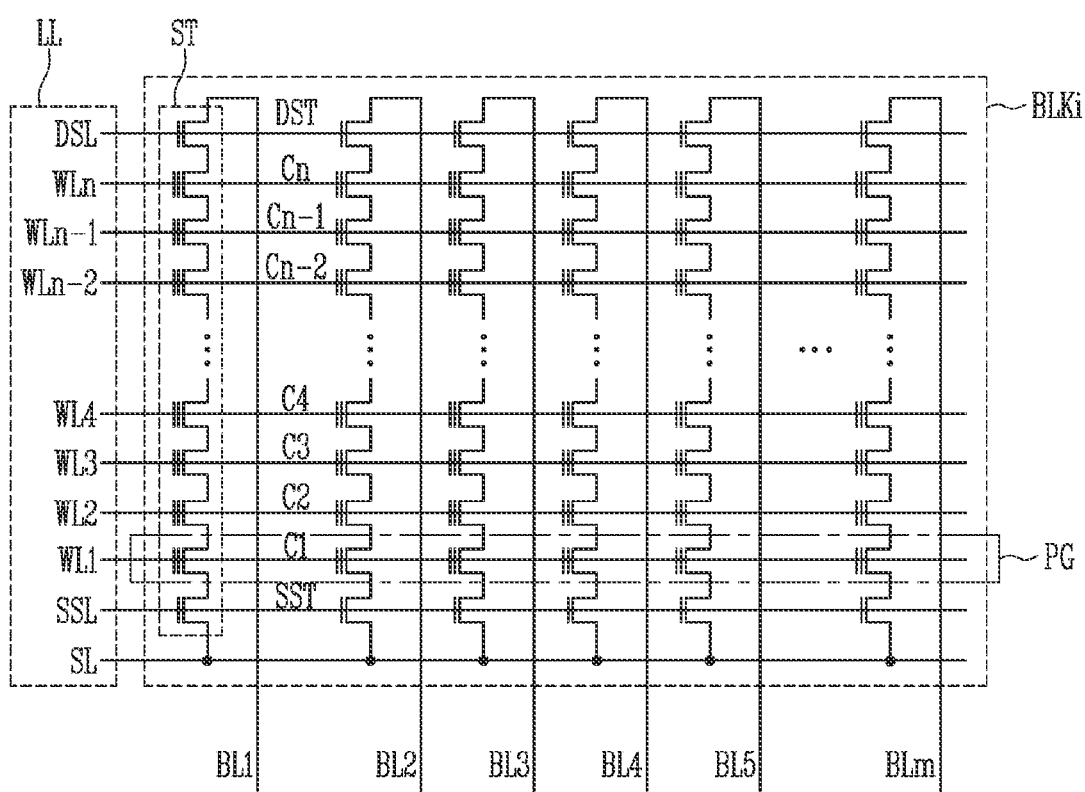
FIG. 4 is a diagram illustrating a memory block shown in FIG. 3.

FIG. 4 is a diagram illustrating the memory block shown in FIG. 3.

Referring to FIG. 4, the memory block BLKi may include a plurality of strings ST connected between first to m-th bit lines BL1 to BLm (m is a positive integer) and a source line SL. Each of the strings ST may include a source select transistor SST, and first to n-th memory cells C1 to Cn, and a drain select transistor DST connected in series between the source line SL and the first to m-th bit lines BL1 to BLm.

Since FIG. 4 is a diagram for describing a configuration of the memory block BLKi, the number of source select transistors SST, first to n-th memory cells C1 to Cn, and drain select transistors DST is not limited to the number shown in FIG. 4.

Gates of the source select transistors SST connected to different strings ST may be connected to a source select line SSL, the gates of each of the first to n-th memory cells C1 to Cn may be connected to first to n-th word lines WL1 to WLn, and gates of the drain select transistors DST may be connected to a drain select line DSL. The source select line SSL, the first to n-th word lines WL1 to WLn, and the drain select line DSL may be included in the local lines LL.

A group of memory cells connected to the same word line and included in different strings ST may configure one page PG. The memory cells may be programmed or read in a page PG unit. The first to m-th bit lines BL1 to BLm may be connected to the page buffers included in the page buffer group 114 of FIG. 2, respectively.

Figure 5:
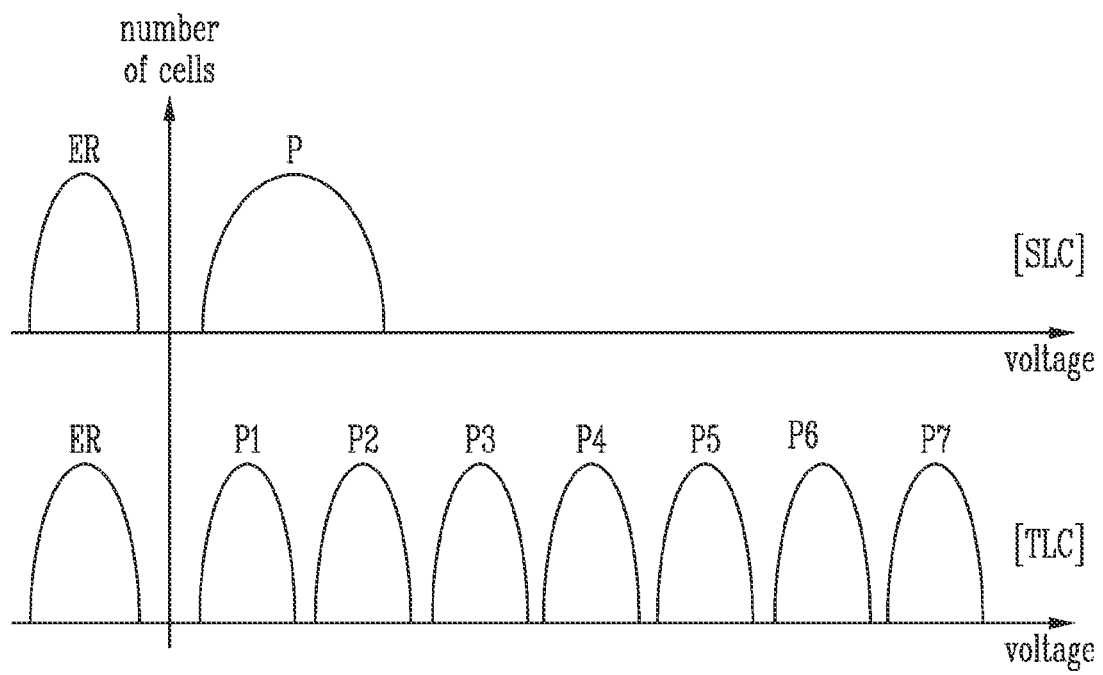
FIG. 5 is a diagram illustrating a threshold voltage of memory cells according to a program method.

FIG. 5 is a diagram illustrating a threshold voltage of memory cells according to a program method.

Referring to FIG. 5, the program operation may be performed in a single level cell (SLC) or multi-level cell (MLC) method. The SLC method is a method in which one bit of data is stored in one memory cell, and the MLC method is a method in which two or more bits of data is stored in one memory cell. The MLC method may be classified into a triple level cell (TLC) method, a quadruple level cell (QLC) method, and the like according to the number of bits stored in one memory cell. In FIG. 5, a threshold voltage distribution of the SLC method and the TLC method is shown as an example.

In the program operation of the SLC method, the memory cells may be divided into an erase status ER or a program status P according to a threshold voltage. In the program operation of the TLC method, the memory cells may be divided into an erase status ER and seven program statuses P1 to P7 according to a threshold voltage. The memory device may perform the program operation in the SLC method or the TLC method according to a type of a program command, and may perform the read operation in the SLC method or the TLC method according to a type of a read command.

Figure 6:
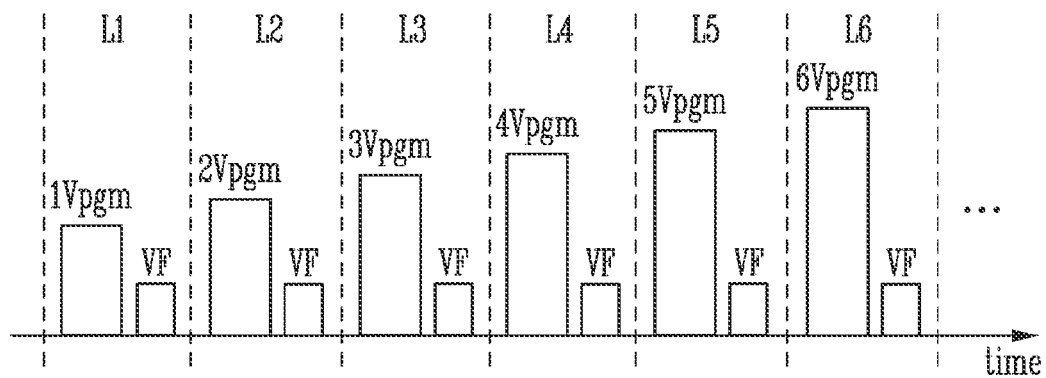
FIG. 6 is a diagram illustrating a program operation of an incremental step pulse program (ISPP) method.

FIG. 6 is a diagram illustrating a program operation of an incremental step pulse program (ISPP) method.

Referring to FIG. 6, the program operation according to the present embodiment may be performed in the ISPP method in which a program voltage is gradually increased. That is, the program operation of the SLC method of FIG. 5 or the TLC method of FIG. 5 may be performed in the ISPP method. In the program operation of the ISPP method, a plurality of program loops L1 to L6, . . . may be performed.

When the entire program operation of a selected page is defined as a main program operation, in each of the plurality of program loops L1 to L6, . . . , a sub program operation in which the program voltage is applied to a selected word line, and a verify operation for determining whether selected memory cells are programmed may be performed. For example, in the sub program operation of the first program loop L1, a first program voltage 1Vpgm may be applied to the selected word line, and in the verify operation, a verify voltage VF may be applied to the selected word line. The first program voltage 1Vpgm may be the lowest voltage among program voltages used in the main program operation. The verify voltage VF may be set to a different level according to a target voltage. In the verify operation, when the threshold voltage of the memory cell is lower than the verify voltage VF, 1 data may be stored in the page buffer, and when the threshold voltage is greater than the verify voltage VF, 0 data may be stored in the page buffer. The read operation may also be performed in the same method as the verify operation.

When all threshold voltages of the selected memory cells are higher than a target verify voltage, the verify operation may be passed and the main program operation may be terminated. When the verify operation is failed until the number of program loops L1 to L6, . . . reaches a maximum number, the selected memory block may be processed as a bad block.

Figure 7:
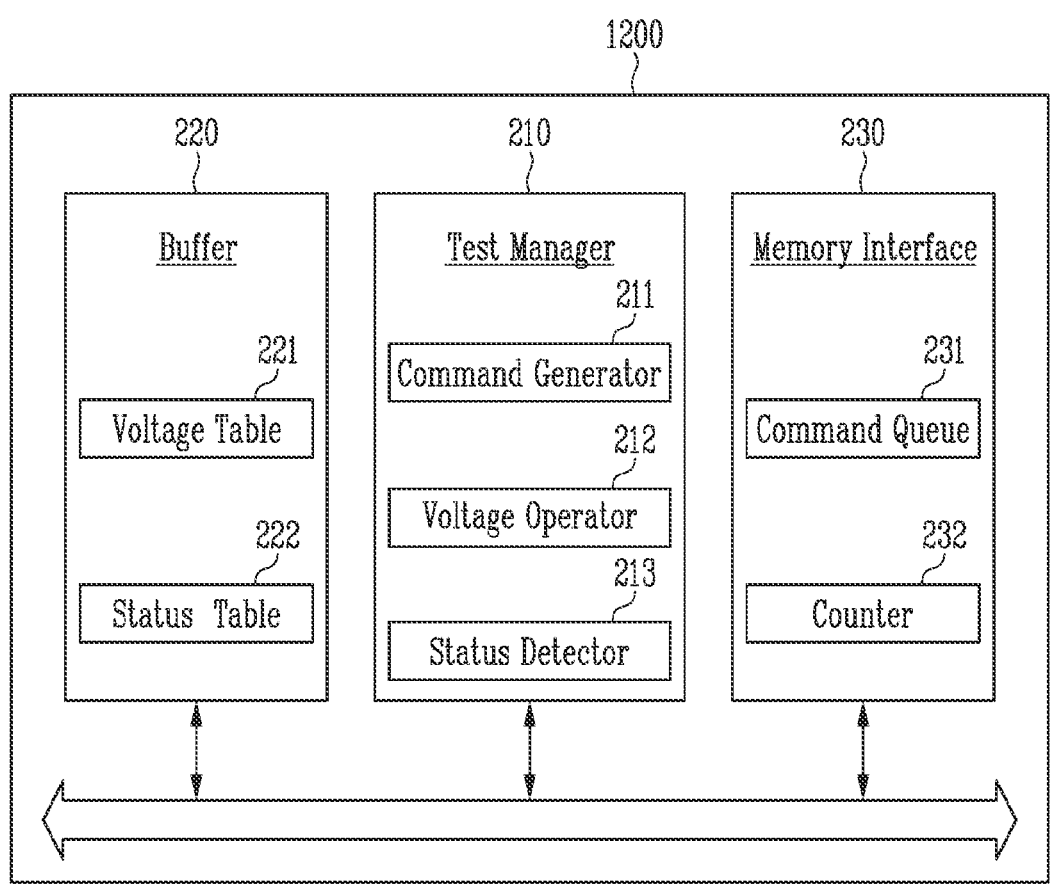
FIG. 7 is a diagram illustrating a controller according to an embodiment of the present disclosure.

FIG. 7 is a diagram illustrating a controller according to an embodiment of the present disclosure.

Referring to FIG. 7, the controller 1200 may include a test manager 210, a buffer 220, and a memory interface 230.

The test manager 210 may be configured to generate a command for controlling a test operation of the memory device in a test mode, operate voltages used during the test operation, and generate status information of the memory blocks according to a result of the test operation. The test manager 210 may include a command generator 211, a voltage operator 212, and a status detector (status determiner) 213.

The command generator 211 may be configured to generate the program command, the suspend command, and the read command for the test operation, and output the generated command. For example, in a test operation mode, the command generator 211 may generate the program command of the SLC method, generate the suspend command for suspending the program operation, and generate the read command of the TLC method.

The voltage operator 212 may be configured to output a voltage difference by operating read voltages used in the test operation. For example, when the first and second read voltages are used in the test operation, the voltage operator 212 may operate a subtraction of the first and second read voltages, and output an absolute value of the operated value as the voltage difference. When the second read voltage is higher than the first read voltage, the voltage operator 212 may output a value obtained by subtracting the first read voltage from the second read voltage as the voltage difference. Alternatively, the voltage operator 212 may output an absolute value of a value obtained by subtracting the second read voltage from the first read voltage as the voltage difference.

The status detector 213 may be configured to generate and output the status information according to the result of the test operation. For example, the status detector 213 may be configured to determine a status of the memory block according to the count value of data read from the memory block and generate the status information during the test operation. Alternatively, the status detector 213 may be configured to compare the voltage difference output from the voltage operator 212 and a reference value, determine the status of the memory block according to a comparison result, and generate the status information during the test operation.

The buffer 220 may be configured to store various pieces of information or values used in the controller 1200. For example, the buffer 220 may include a voltage table 221 in which various voltage values for the read voltages used in the test operation are stored, and may include a status table 222 in which the status information for each of the memory blocks is stored.

The memory interface 230 may be configured to transmit a command, an addresses, and data between the controller 1200 and the memory device, and count the number of 0 or 1, or the number of 0 and 1 of data output from the memory device. For example, the memory interface 230 may include a command queue 231 and a counter 232.

The command queue 231 may be configured to sequentially output commands output from the test manager 210 to the memory device according to set order and time. For example, the command queue 231 may be configured to queue the program command, the suspend command, a resume command, and a plurality of read commands, and sequentially output the commands according to a predetermined output order during the test operation. The word "predetermined" as used herein with respect to a parameter, such as a predetermined output order, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The counter 232 may be configured to count the number of 0 or 1 or the number of 0 and 1 of the data output from the memory device. For example, the counter 232 may be configured to output the count value obtained by counting only the number of 0 among the received data, output the count value obtained by counting only the number of 1, or output the count value obtained by counting the number of 0 and the count value obtained by counting the number of 1.

Figure 8:
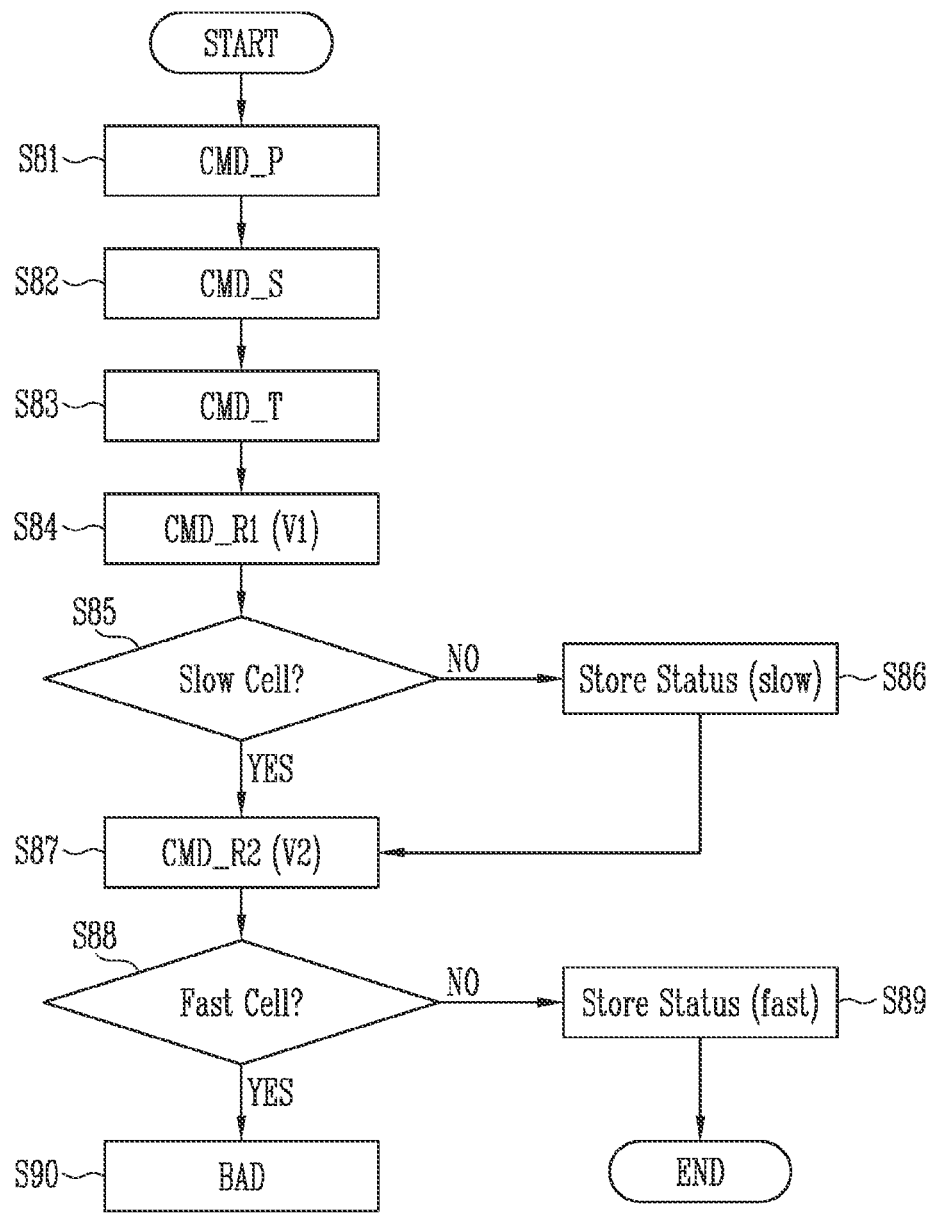
FIG. 8 is a flowchart illustrating a method of operating a memory system according to a first embodiment of the present disclosure.

FIG. 8 is a flowchart illustrating a method of operating a memory system according to a first embodiment of the present disclosure.

Referring to FIG. 8, when the test mode is started, the controller may generate a program command CMD_P and transmit the program command CMD_P to the memory device (S81). At this time, the program command CMD_P may be a command for performing the program operation of the SLC method. The controller may transmit an address of a memory block on which the test operation is to be performed and test data to the memory device together with the program command CMD_P. The memory device may perform the program operation in response to the program command CMD_P.

The test data may be data capable of increasing the threshold voltage of the memory cells, and may be data formed of only logic low data (i.e., "0"). In a memory device set to program 0 data, the test data may be formed of only 0, but in a memory device set to program logic high data (i.e., "1"), the test data may be formed of only 1. For example, in the memory device set to program the 0 data, the memory cells may maintain the erase status by the 1 data and may be programmed by the 0 data. Conversely, in the memory device set to program the 1 data, the memory cells may maintain the erase status by the 0 data and may be programmed by the 1 data. In an embodiment described below, a memory device set to increase the threshold voltage of the memory cells by the 0 data is described as an example. The memory device may perform the program operation by the test data formed of only 0. For example, after storing the 0 data in the page buffers, the memory device may apply a program permission voltage (for example, 0V) corresponding to the 0 data to the bit lines connected to the page buffers. Subsequently, the memory device may program the test data in all memory cells included in the selected page of the selected memory block by applying the program voltage to the selected word line and the pass voltage to unselected word lines.

After outputting the program command CMD_P, the controller may transmit a suspend command CMD_S to the memory device according to a set time (S82). The suspend command is a command for suspending an operation that is being executed in the memory device. Since the memory device is performing the program operation in response to the program command CMD_P, the memory device may suspend the program operation in response to the suspend command CMD_S. For example, in the test mode, a time at which the suspend command CMD_S is output may be set in the controller, and the controller may output the suspend command CMD_S after the set time elapses after the program command CMD_P is output (S81). The set time for outputting the suspend command CMD_S may be set as a time in which the program voltage may be applied twice or more, but in the present embodiment, the set time may be set as a time in which the program voltage is applied once in order to shorten a time required for the test operation. That is, the set time may include a time in which the memory device prepares the program operation in response to the program command CMD_P, and a time in which the program operation is started and the program voltage is applied to the selected word line once.

Since the program operation is suspended while the memory device is performing the program operation, the memory device is in a status in which the program operation is not completed. Therefore, the controller may transmit a termination command CMD_T for terminating the program operation to the memory device (S83).

Subsequently, the controller may transmit a first read command CMD_R1 to the memory device to determine the status of the programmed memory cells (S84). For example, the first read command CMD_R1 may be a command for reading the memory cells using a first read voltage V1, and may be set in the TLC method. For example, in the TLC method, since the number of threshold voltage distributions is greater than that of the SLC method, the number of read voltages that may be used in the read operation is greater by the number of threshold voltage distributions. Therefore, when the first read command CMD_R1 is set in the TLC method, various read voltages may be used in the test operation. The first read voltage V1 may be the lowest read voltage in the TLC method, and may be used to detect memory cells having a relatively low threshold voltage in the test operation. That is, the first read voltage V1 may be a test voltage for detecting a slow cell in which the program operation is slower than a normal speed.

The memory device may output data read from the selected page of the selected memory block to the controller in response to the first read command CMD_R1.

The controller may determine whether the slow cell is included in the selected memory block according to the data output from the memory device (S85). Since the test data is set to 0 in step S81, data of memory cells having a threshold voltage lower than the first read voltage V1 may become 1, and data of memory cells having a threshold voltage equal to or greater than the first read voltage V1 may become 0.

Therefore, in step S85, when the received data does not include 1 or the number of memory cells in which the data is 1 is less than a slow reference number (NO), the controller may store slow status information of the selected memory block as a normal status (S86). The slow reference number may be a reference value for preventing a memory block in which the number of slow cells is small from being processed as the bad block even though the slow cells are included in the memory block, and may be set to a different value according to the memory device.

When all received data is 1 or the number of memory cells in which the data is 1 is equal to or greater than the slow reference number (YES) in step S85, or when the status information is stored in step S86, the controller may transmit a second read command CMD_R2 to the memory device (S87).

The second read command CMD_R2 may be a command for reading the memory cells using a second read voltage V2 higher than the first read voltage V1, and may be set in the TLC method. For example, the second read voltage V2 may be a voltage for reading the memory cells in a second program status in the TLC method, and may be used to detect memory cells having a relatively high threshold voltage in the test operation. That is, the second read voltage V2 may be a test voltage for detecting a fast cell in which the program operation is faster than the normal speed.

The memory device may output the data read from the selected page of the selected memory block to the controller in response to the second read command CMD_R2.

The controller may determine whether the fast cell is included in the selected memory block according to the data output from the memory device (S88). Since the test data is set to 0 in step S81, data of memory cells having a threshold voltage lower than the second read voltage V2 may become 1, and data of memory cells having a threshold voltage equal to or greater than the second read voltage V2 may become 0.

Therefore, in step S88, when the received data does not include 0 or the number of memory cells in which the data is 0 is less than a fast reference number (NO), the controller may store fast status information of the selected memory block as the normal status (S89). The fast reference number may be a reference value for preventing a memory block in which the number of fast cells is small from being processed as the bad block even though the fast cells are included in the memory block, and may be set to a different value according to the memory device. When it is determined that a fast status of the selected memory block is normal, the controller may terminate the test operation of the selected memory block.

In step S88, when all data are 0 or the number of memory cells in which data is 0 is equal to or greater than the fast reference number (YES), the controller may process the selected memory block as the bad block (S90).

Figure 9:
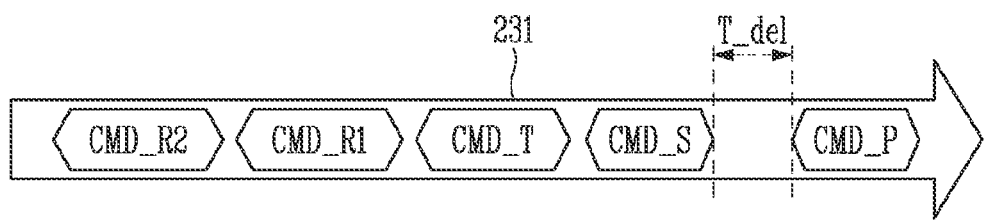
FIG. 9 is a diagram illustrating a command transmission method according to the first embodiment.

FIG. 9 is a diagram illustrating a command transmission method according to the first embodiment.

Referring to FIG. 9, the commands output from the controller during the test operation of the selected memory block are shown. For example, the command queue 231 included in the controller may temporarily store the commands output from the test manager 210 of FIG. 7, determine an output order and an output time of the commands, and sequentially output the commands. For example, when the program command CMD_P, the suspend command CMD_S, the termination command CMD_T, the first read command CMD_R1, and the second read command CMD_R2 are input to the command queue 231, the command queue may queue the commands in an order of the program command CMD_P, the suspend command CMD_S, the termination command CMD_T, the first read command CMD_R1, and the second read command CMD_R2. Since the program command CMD_P used in the test operation of the present embodiment is a normal program command used in the memory device, the memory device may perform a normal program operation in response to the program command. For example, the memory device may perform the program operation in the ISPP method. Since a plurality of program loops are performed in the program operation of the ISPP method, in the test operation, the suspend command CMD_S may be used to perform only the first program loop or some operations included in the first program loop. Therefore, in the present embodiment, a time required for the test operation may be determined according to a delay time T_del between the output of the program command CMD_P and the output of the suspend command CMD_S. For example, the delay time T_del may include a time for the memory device to set up voltages for the program operation after the program command CMD_P is output, and a time in which the program voltage is applied to the selected word line a set number of times. Therefore, the command queue 231 may output the suspend command CMD_S at a time point at which the delay time T_del elapses after outputting the program command CMD_P. The set number of times may be set as once in order to shorten the time required for the test operation.

Subsequently, the command queue 231 may output the termination command CMD_T for terminating the program operation in the memory device, and may output the first read command CMD_R1 for reading the threshold voltage of the memory cells. When data read according to the first read command CMD_R1 is received by the controller, the command queue 231 may output the second read command CMD_R2.

Figure 10:
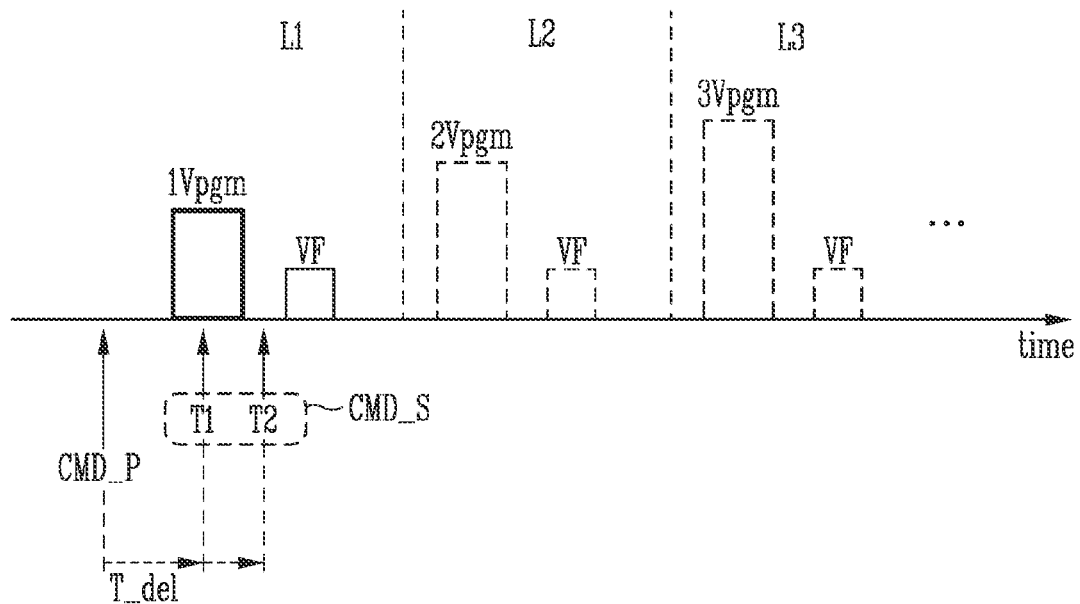
FIG. 10 is a diagram illustrating an output time of a suspend command according to the first embodiment.

FIG. 10 is a diagram illustrating an output time of a suspend command according to the first embodiment.

Referring to FIG. 10, the suspend command CMD_S may be output at a time point at which the delay time T_del elapses after the program command CMD_P is output. The delay time T_del may be set so that the first program voltage 1Vpgm is applied to the selected word line once. For example, the delay time T_del may be set to a first time T1 so that the suspend command CMD_S may be output while the first program voltage 1Vpgm is applied to the selected word line. When the suspend command CMD_S is input while the first program voltage 1Vpgm is applied to the selected word line, the memory device may apply the first program voltage 1Vpgm to the selected word line during a preset time in the program operation and then suspend the program operation. That is, even though the suspend command CMD_S is received, the memory device may suspend the program operation after completing a program voltage application operation of a currently performing program loop. Therefore, in order to suspend the program operation after the first program voltage 1Vpgm is applied to the selected word line during the preset time, the suspend command CMD_S may be output at a first time T1 when the first program voltage 1Vpgm is applied to the selected word line or may be output at a second time T2 between the operation in which the program voltage is applied and the verify operation. That is, when the suspend command CMD_S is output at the first or second time T1 or T2 before the verify operation is performed, the program operation may be suspended after the operation of applying the first program voltage 1Vpgm to the selected word line is performed.

FIG. 11 is a diagram illustrating a voltage table according to the first embodiment.

Referring to FIG. 11, in the first embodiment, the read operation using the first read voltage V1 may be performed in response to the first read command, and the read operation using the second read voltage V2 may be performed in response to the second read command. In the voltage table 221, a first voltage code Vcd1 for the first read voltage V1 may be stored in correspondence with a first index IND_t1, and a second voltage code Vcd2 for the second read voltage V2 may be stored in correspondence with a second index IND_t2.

For example, when the command generator 212 of FIG. 7 outputs the first read command, the first index IND_t1 corresponding to the first read command may be transmitted to the buffer 220 of FIG. 7, and the buffer 220 may output the first voltage code Vcd1 corresponding to the first index IND_t1 from the voltage table 221. After the first read operation is completed, when the command generator 211 outputs the second read command, the second index IND_t2 corresponding to the second read command may be transmitted to the buffer 220, and the buffer 220 may output the second voltage code Vcd2 corresponding to the second index IND_t2 from the voltage table 221.

The second read voltage V2 may be higher than the first read voltage V1. The first read voltage V1 may be the lowest read voltage that may be used in the read operation of the TLC method, and the second read voltage V2 may be a second lowest read voltage next to the first read voltage V1 that may be used in the read operation of the TLC method.

FIG. 12 is a diagram illustrating a method of checking a status of memory cells in a test operation according to the first embodiment.

Referring to FIG. 12, the threshold voltage of the memory cells may be increased by the first program voltage. At this time, it is assumed that a threshold voltage distribution of normal memory cells that may be increased by the first program voltage is between the first read voltage V1 and the second read voltage V2.

When the threshold voltage of the memory cells included in the selected memory block is present between the first read voltage and the second read voltage (V1 to V2), the status detector 213 of FIG. 7 may determine the selected memory block as a normal status STn, when the threshold voltage is lower than the first read voltage V1, the status detector 213 may determine the selected memory block as a slow status STs, and when the threshold voltage is higher than the second read voltage V2, the status detector 213 may determine the selected memory block as a fast status STf.

The status detector 213 may classify the status of the selected memory block into the normal status STn, the slow status STs, or the fast status STf according to data output from each of the first and second read operations, and may process the memory block determined as the fast status STf as the bad block.

In the first read operation, the data of the memory cells of which the threshold voltage is higher than the first read voltage V1 may be 0, and the data of the memory cells of which the threshold voltage is lower than the first read voltage V1 may be 1. The counter 232 of FIG. 7 included in the controller may count the number of 0 and 1 included in the data received from the memory device, and transmit a count value output as a count result to the status detector 213. The status detector 213 may determine the status of the selected memory block as the normal status STn or the slow status STs according to the count value.

In the second read operation, the data of the memory cells of which the threshold voltage is higher than the second read voltage V2 may be 0, and the data of the memory cells of which the threshold voltage is lower than the second read voltage V2 may be 1. The counter 232 of FIG. 7 included in the controller may count the number of 0 and 1 included in the data received from the memory device, and transmit a count value output as a count result to the status detector 213. The status detector 213 may determine the status of the selected memory block as the normal status STn or the fast status STf according to the count value, and may process the memory block determined as the fast status STf as the bad block.

A process of determining the status of the memory block according to the data received from the memory device is described as follows.

Figure 13:
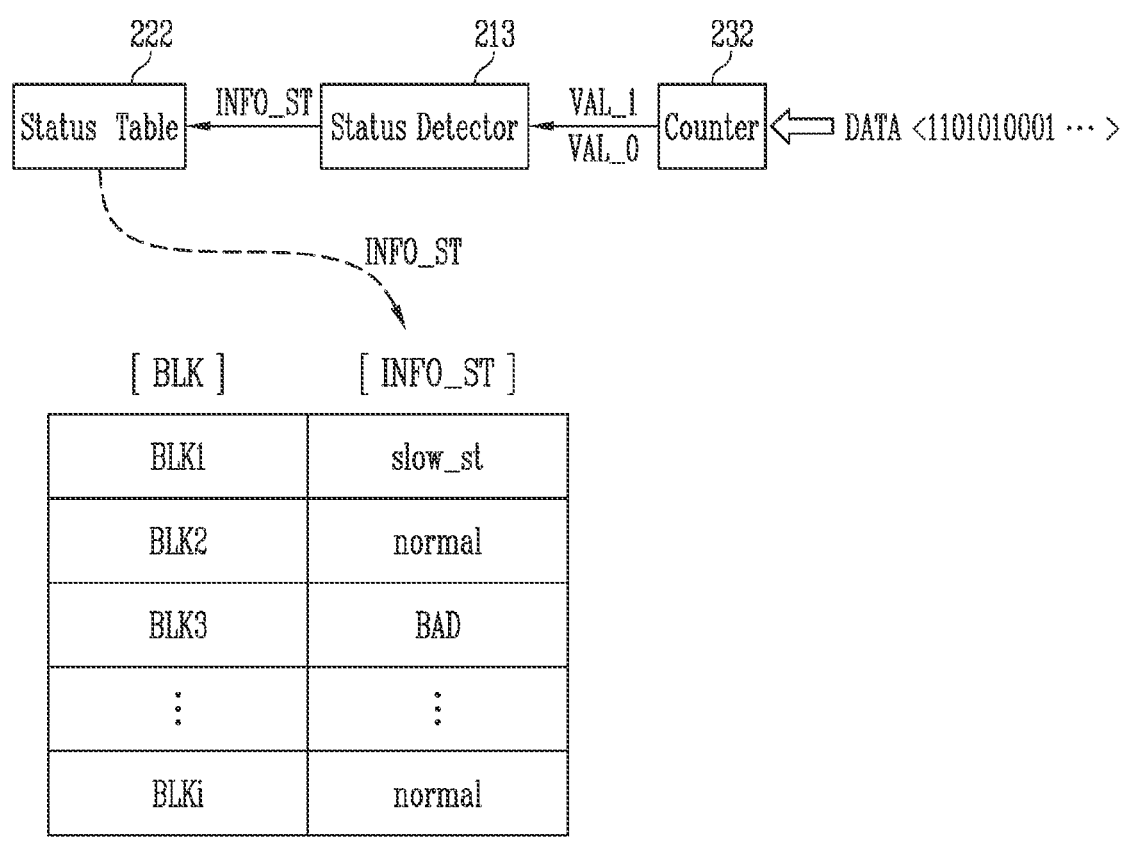
FIG. 13 is a diagram illustrating a method of determining a status of a memory block according to the first embodiment.

FIG. 13 is a diagram illustrating a method of determining a status of a memory block according to the first embodiment.

Referring to FIG. 13, when the memory device outputs read data DATA, the counter 232 may count each of the number of 0 data and the number of 1 data included in the data DATA. For example, the counter 232 may count 0 data to output a first count value VAL_0, and count 1 data to output a second count value VAL_1.

The status detector 213 may generate status information INFO_ST by determining the status of the memory block according to the first and second count values VAL_0 and VAL_1.

In a case where the first and second count values VAL_0 and VAL_1 are values for the data output in the first read operation, when the number of second count values VAL_1 is greater than the slow reference number, the status detector 213 may generate the status information INFO_ST indicating that the status of the selected memory block is in the status. When the number of second count values VAL_1 is less than the slow reference number, the status detector 213 may generate the status information INFO_ST indicating that the slow status of the selected memory block is the normal status.

In a case where the first and second count values VAL_0 and VAL_1 are values for the data output in the second read operation, when the number of first count values VAL_0 is greater than the fast reference number, the status detector 213 may generate the status information INFO_ST indicating that the selected memory block is the bad block. When the number of first count values VAL_0 is less than the fast reference number, the status detector 213 may generate the status information INFO_ST indicating that the status of the selected memory block is the normal status. The status detector 213 may store the generated status information INFO_ST in the status table 222.

The status table 222 may store the status information INFO_ST corresponding to each of the first to i-th memory blocks BLK1 to BLKi. Referring to an example of the status table 222 shown in FIG. 13, the status information INFO_ST of the first memory block BLK1 indicates the slow status, which means that the first memory block BLK1 is not the bad block but includes the slow cells. The status information INFO_ST of the second memory block BLK2 indicates the normal status, and the status information INFO_ST of the third memory block BLK3 indicates the bad block BAD.

The controller may perform normal operations by referring to the status information of memory blocks stored in the status table 222. For example, the controller may set up the program, read, or erase operation using basic values set in the controller during the program, read, or erase operation with respect to the memory blocks which are in the normal status. With respect to the memory blocks which are in the slow status, the controller may manage an address so that the number of times program and erase operations are performed is less than that of the memory blocks which are in the normal status.

Figure 14:
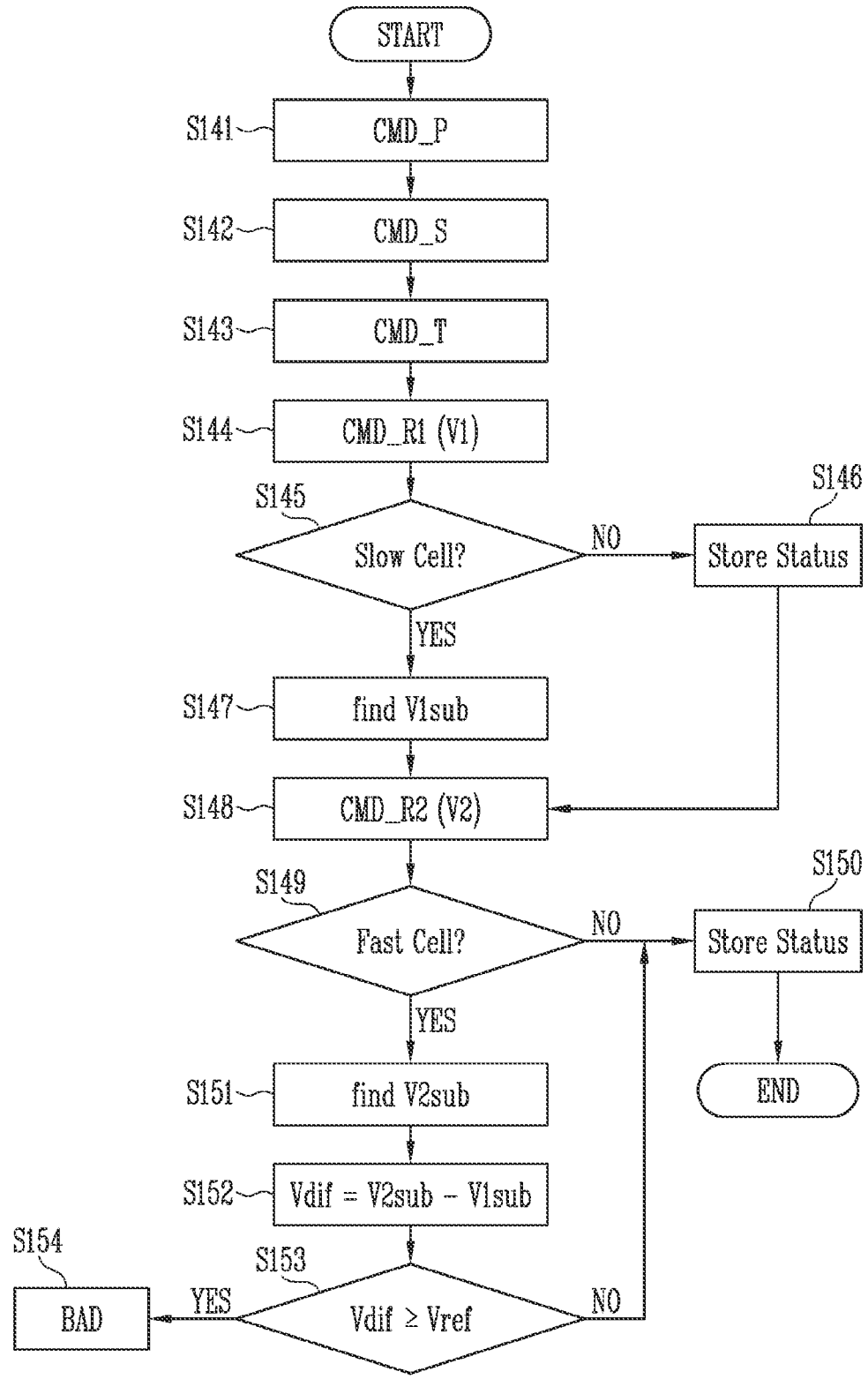
FIG. 14 is a flowchart illustrating a method of operating a memory system according to a second embodiment of the present disclosure.

FIG. 14 is a flowchart illustrating a method of operating a memory system according to a second embodiment of the present disclosure.

When the test mode is started, the controller may generate a program command CMD_P and transmit the program command CMD_P to the memory device (S141). At this time, the program command CMD_P may be a command for performing the program operation of the SLC method. The controller may transmit an address of a memory block on which the test operation is to be performed and test data to the memory device together with the program command CMD_P. The memory device may perform the program operation in response to the program command CMD_P.

The test data may be data capable of increasing the threshold voltage of the memory cells, and may be data formed of only 0. In a memory device set to program 0 data, the test data may be formed of only 0, but in a memory device set to program 1 data, the test data may be formed of only 1. For example, in the memory device set to program the 0 data, the memory cells may maintain the erase status by the 1 data and may be programmed by the 0 data. Conversely, in the memory device set to program the 1 data, the memory cells may maintain the erase status by the 0 data and may be programmed by the 1 data. In an embodiment described below, a memory device set to increase the threshold voltage of the memory cells by the 0 data is described as an example. The memory device may perform the program operation by the test data formed of only 0. For example, after storing the 0 data in the page buffers, the memory device may apply a program permission voltage (for example, 0V) corresponding to the 0 data to the bit lines connected to the page buffers. Subsequently, the memory device may program the test data in all memory cells included in the selected page of the selected memory block by applying the program voltage to the selected word line and the pass voltage to unselected word lines.

After outputting the program command CMD_P, the controller may transmit a suspend command CMD_S to the memory device according to a set time (S142). The suspend command is a command for suspending an operation that is being executed in the memory device. Since the memory device is performing the program operation in response to the program command CMD_P, the memory device may suspend the program operation in response to the suspend command CMD_S. For example, in the test mode, a time at which the suspend command CMD_S is output may be set in the controller, and the controller may output the suspend command CMD_S after the set time elapses after the program command CMD_P is output (S141). The set time for outputting the suspend command CMD_S may be set as a time in which the program voltage may be applied twice or more, but in the present embodiment, the set time may be set as a time in which the program voltage is applied once in order to shorten a time required for the test operation. That is, the set time may include a time in which the memory device prepares the program operation in response to the program command CMD_P, and a time in which the program operation is started and the program voltage is applied to the selected word line once.

Subsequently, the controller may transmit a first read command CMD_R1 to the memory device to determine the status of the programmed memory cells (S144). For example, the first read command CMD_R1 may be a command for reading the memory cells using a first read voltage V1, and may be set in the TLC method. For example, in the TLC method, since the number of threshold voltage distributions is greater than that of the SLC method, the number of read voltages that may be used in the read operation is greater by the number of threshold voltage distributions. Therefore, when the first read command CMD_R1 is set in the TLC method, various read voltages may be used in the test operation. The first read voltage V1 may be the lowest read voltage in the TLC method, and may be used to detect memory cells having a relatively low threshold voltage in the test operation. That is, the first read voltage V1 may be a test voltage for detecting a slow cell in which the program operation is slower than a normal speed.

The memory device may output data read from the selected page of the selected memory block to the controller in response to the first read command CMD_R1.

The controller may determine whether the slow cell is included in the selected memory block according to the data output from the memory device (S145). Since the test data transmitted to the memory device is 0 in step S141, data of memory cells having a threshold voltage lower than the first read voltage V1 may become 1, and data of memory cells having a threshold voltage equal to or greater than the first read voltage V1 may become 0.

Therefore, in step S145, when the received data does not include 1 or the number of memory cells in which the data is 1 is less than a slow reference number (NO), the controller may store slow status information of the selected memory block as a normal status (S146). The slow reference number may be a reference value for preventing a memory block in which the number of slow cells is small from being processed as the bad block even though the slow cells are included in the memory block, and may be set to a different value according to the memory device.

When all received data is 1 or the number of memory cells in which the data is 1 is equal to or greater than the slow reference number (YES) in step S145, the controller may perform a first sub read operation for finding a first sub read voltage V1sub. For example, the first sub read operation may include a plurality of read operations of reading the memory cells using a plurality of sub read voltages, respectively. The first sub read operation may be performed to find a read voltage at which the number of slow cells starts to become smaller than the slow reference number. To this end, in the first sub read operation, a plurality of read operations using the sub read voltages gradually lower than the first read voltage V1 may be sequentially performed. When a read voltage in which the number of slow cells is smaller than the slow reference number is detected in step S147 or the status information is stored in step S146, the controller may transmit a second read command CMD_R2 to the memory device (S148).

Subsequently, the controller may transmit a first read command CMD_R1 to the memory device to determine the status of the programmed memory cells (S144). For example, the first read command CMD_R1 may be a command for reading the memory cells using a first read voltage V1, and may be set in the TLC method. For example, in the TLC method, since the number of threshold voltage distributions is greater than that of the SLC method, the number of read voltages that may be used in the read operation is greater by the number of threshold voltage distributions. Therefore, when the first read command CMD_R1 is set in the TLC method, various read voltages may be used in the test operation. The first read voltage V1 may be the lowest read voltage in the TLC method, and may be used to detect memory cells having a relatively low threshold voltage in the test operation. That is, the first read voltage V1 may be a test voltage for detecting a slow cell in which the program operation is slower than a normal speed.

When all received data is 1 or the number of memory cells in which the data is 1 is equal to or greater than the slow reference number (YES) in step S145, the controller may perform a first sub read operation for finding a first sub read voltage V1sub. For example, the first sub read operation may include a plurality of read operations of reading the memory cells using a plurality of sub read voltages, respectively. The first sub read operation may be performed to find a read voltage at which the number of slow cells starts to become smaller than the slow reference number. To this end, in the first sub read operation, a plurality of read operations using the sub read voltages gradually lower than the first read voltage V1 may be sequentially performed. When a read voltage in which the number of slow cells is smaller than the slow reference number is detected in step S146 or the status information is stored in step S146, the controller may transmit a second read command CMD_R2 to the memory device (S148).

The second read command CMD_R2 may be a command for reading the memory cells using a second read voltage V2 higher than the first read voltage V1, and may be set in the TLC method. For example, the second read voltage V2 may be a voltage for reading the memory cells in a second program status in the TLC method, and may be used to detect memory cells having a relatively high threshold voltage in the test operation. That is, the second read voltage V2 may be a test voltage for detecting a fast cell in which the program operation is faster than the normal speed.

The memory device may output the data read from the selected page of the selected memory block to the controller in response to the second read command CMD_R2.

The controller may determine whether the fast cell is included in the selected memory block according to the data output from the memory device (S149). Data of memory cells having a threshold voltage lower than the second read voltage V2 may become 1, and data of memory cells having a threshold voltage equal to or greater than the second read voltage V2 may become 0.

Therefore, in step S149, when the received data does not include 0 or the number of memory cells in which the data is 0 is less than a fast reference number (NO), the controller may store fast status information of the selected memory block as the normal status (S150). The fast reference number may be a reference value for preventing a memory block in which the number of fast cells is small from being processed as the bad block even though the fast cells are included in the memory block, and may be set to a different value according to the memory device. When it is determined that a status of the selected memory block is normal status, the controller may terminate the test operation of the selected memory block.

In step S149, when all data are 0 or the number of memory cells in which data is 0 is equal to or greater than the fast reference number (YES), the controller may perform a second sub read operation for finding a second sub read voltage V2sub. For example, the second sub read operation may include a plurality of read operations of reading the memory cells using a plurality of sub read voltages, respectively. The second sub read operation may be performed to find a read voltage at which the number of fast cells starts to become smaller than the fast reference number. To this end, in the second sub read operation, a plurality of read operations using the sub read voltages gradually lower than the second read voltage V2 may be sequentially performed.

When a read voltage in which the number of fast cells is less than the fast reference number is detected in step S151, the controller may calculate a voltage difference Vdif between the first sub read voltage V1sub detected in step S147 and the second sub read voltage V2sub detected in step S151 (S152).

Subsequently, the controller may determine the status of the memory block by comparing the voltage difference Vdif and a reference voltage Vref (S153).

When the voltage difference Vdif is equal to or greater than the reference voltage Vref (YES), the controller may process the memory block as the bad block (S154). That is, since a case where the voltage difference Vdif is greater than the reference voltage (Vref) means that a width of the threshold voltage distribution is wide by the slow cells and the fast cells in the memory block, and thus the controller may process such a memory block as the bad block.

In step S153, when the voltage difference Vdif is less than the reference voltage Vref (NO), the controller may generate and store the status information of the memory block (S150). That is, since a case where the voltage difference Vdif is less than the reference voltage Vref means that the slow cells and the fast cells are included in the memory block but reliability is not low enough to cause an error, the controller might not process such memory block as the bad block and store the status information of the memory block.

The controller may adjust the number of times the memory blocks are operated in a subsequent operation according to the status information of the memory blocks stored in steps S146 and S150.

FIG. 15 is a diagram illustrating a voltage table according to the second embodiment.

Referring to FIG. 15, in the second embodiment, a plurality of sub read voltages may be used to find a threshold voltage at which the slow cells are distributed (refer to step S147 of FIG. 14) and a threshold voltage at which the fast cells are distributed (refer to step S151 of FIG. 14).

The voltage table 221 may store read voltages having various levels that may be used in such read operations, and voltage codes for each of the sub read voltages.

For example, in the voltage table 221, a first voltage code Vcd1 for the first read voltage V1 may be stored in correspondence with a first index IND_t1, and sub voltage codes Vcd11, Vcd12, and Vcd13 for each of the first sub read voltages V1sub that may be used in the first sub read operations may be stored in correspondence with different indices IND_t1_A1 to A3. In addition, in the voltage table 221, a second voltage code Vcd2 for the second read voltage V2 may be stored in correspondence with a second index IND_t2, and sub voltage codes Vcd21, Vcd22, and Vcd23 for each of the second sub read voltages V2sub that may be used in the second sub read operations may be stored in correspondence with different indices IND_t2_B1 to B3.

The first and second sub read voltages V1sub and V2sub are described as follows.

The first sub read voltages V1 sub may be voltages for checking distribution of the slow cells, and may include eleventh to thirteenth sub read voltages V1−A1 to A3. The eleventh sub read voltage V1−A1 may be set to a level lower than the first read voltage V1 by A1, the twelfth sub read voltage V1−A2 may be set to a level lower than the first read voltage V1 by A2, and the thirteenth sub read voltage V1−A3 may be set to a level lower than the first read voltage V1 by A3. A2 may be a positive voltage higher than A1, and A3 may be a positive voltage higher than A2.

The second sub read voltages V2sub may be voltages for checking distribution of the fast cells, and may include twenty-first to twenty-third sub read voltages V2+B1 to B3. The twenty-first sub read voltage V2+B1 may be set to a level higher than the second read voltage V2 by B1, the twenty-second sub read voltage V2+B2 may be set to a level higher than the second read voltage V2 by B2, and the twenty-third sub read voltage V2+B3 may be set to a level higher than the second read voltage V2 by B3. B2 may be a positive voltage higher than B1, and B3 may be a positive voltage higher than B2.

Figure 16:
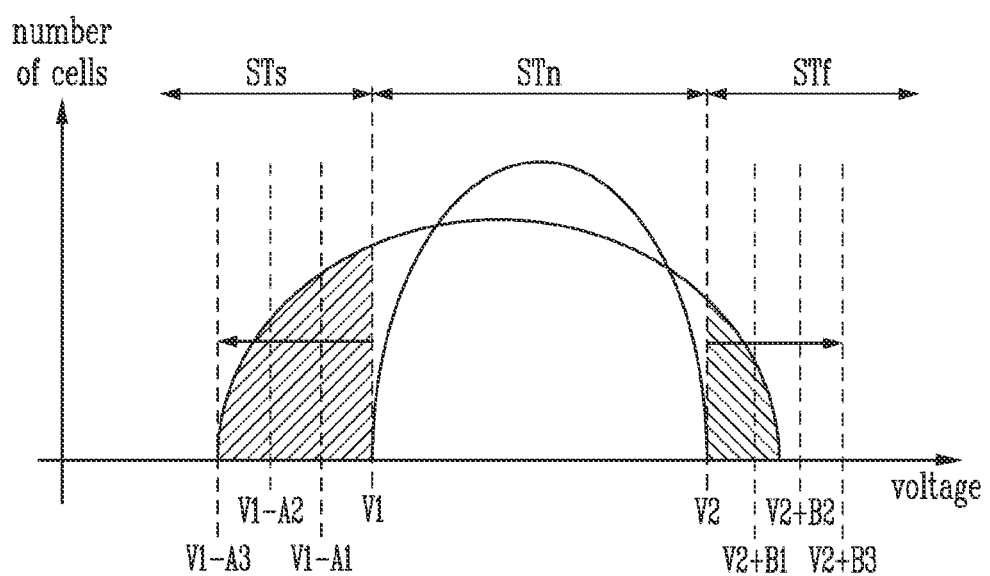
FIG. 16 is a diagram illustrating a method of checking a status of memory cells in a test operation according to the second embodiment.

FIG. 16 is a diagram illustrating a method of checking a status of memory cells in a test operation according to the second embodiment.

Referring to FIG. 16, the threshold voltage of the memory cells may be increased by the first program voltage. At this time, it is assumed that a threshold voltage distribution of normal memory cells that may be increased by the first program voltage is between the first read voltage V1 and the second read voltage V2.

When the threshold voltage of the memory cells included in the selected memory block is present between the first read voltage and the second read voltage (V1 to V2), the status detector 213 of FIG. 7 may determine the selected memory block as a normal status STn.

As a result of the first read operation, when it is determined that the threshold voltage of the memory cells is lower than the first read voltage V1, the controller may perform the first sub read operations using the eleventh to thirteenth sub read voltages V1−A1 to A3 that are gradually decreased from the first read voltage V1. For example, when the sub read operation using the eleventh sub read voltage V1−A1 is performed, the status detector 213 of FIG. 7 may determine whether the number of slow cells detected in the selected sub read operation is less than the slow reference number. When it is determined that the number of slow cells is greater than the slow reference number, the controller may perform the sub read operation using the twelfth sub read voltages V1−A2. When it is determined that the number of slow cells is greater than the slow reference number also in the sub read operation using the twelfth sub read voltage V1−A2, the controller may perform the sub read operation using the thirteenth sub read voltage V1−A3. When it is determined that the number of slow cells is less than the slow reference number in the sub read operation using the thirteenth sub read voltage V1−A3, the controller may temporarily store the thirteenth sub read voltage V1−A3 for the operation (step S151 of FIG. 14).

As a result of the second read operation, when it is determined that the threshold voltage of the memory cells is higher than the second read voltage V2, the controller may perform the second sub read operations using the twenty-first to twenty-third sub read voltages V2+B1 to B3 that are gradually increased from the second read voltage V2. For example, when the sub read operation using the twenty-first sub read voltage V2+B1 is performed, the status detector 213 of FIG. 7 may determine whether the number of fast cells detected in the selected sub read operation is less than the fast reference number. When it is determined that the number of fast cells is greater than the fast reference number, the controller may perform the sub read operation using the twenty-second sub read voltage V2+B2. Even though the fast cells are detected in the sub read operation using the twenty-second sub read voltage V2+B2, when it is determined that the number of fast cells is less than the fast reference number, the controller may temporarily store the twenty-second sub read voltage V2+B2 for the operation (step S151 of FIG. 14).

The controller may calculate a voltage difference between the temporarily stored twenty-second sub read voltage V2+B2 and thirteenth sub read voltage V1−A3, compare the voltage difference with a reference voltage, and determine the status of the selected memory block.

Figure 17:
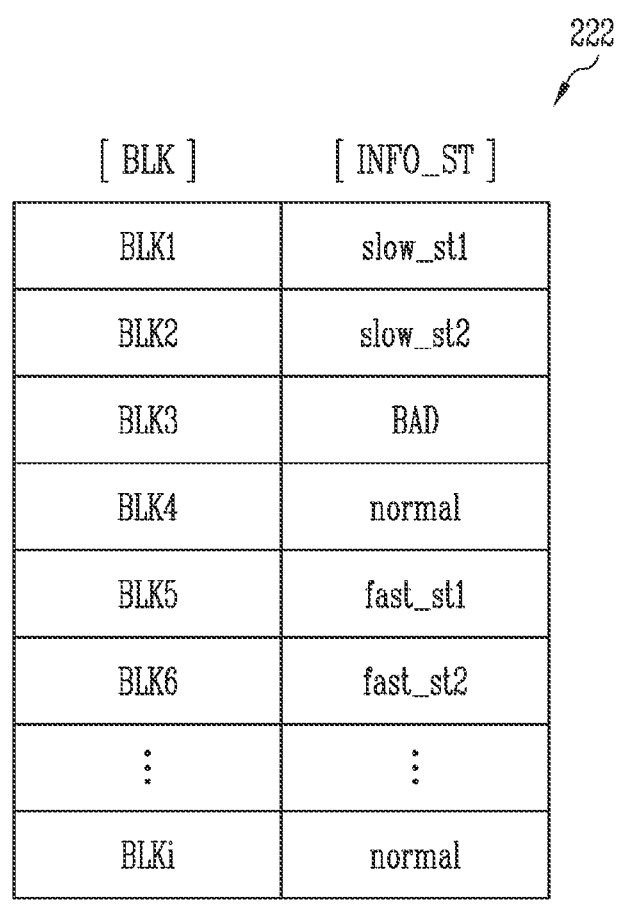
FIG. 17 is a diagram illustrating a status table according to the second embodiment.

FIG. 17 is a diagram illustrating a status table according to the second embodiment.

Referring to FIG. 17, the status table 222 may store status information INFO_ST for each of the first to i-th memory blocks BLK1 to BLKi. Referring to the status table 222 shown in FIG. 17, the status information INFO_ST of the first memory block BLK1 may indicate a first slow status slow_st1, which may indicate a status in which a voltage difference between the lowest threshold voltage and the highest threshold voltage is less than a reference voltage but the number of slow cells that are included in the memory block are more than the fast cells. The status information INFO_ST of the second memory block BLK2 may indicate a second slow status slow_st2, which may indicate a status in which the voltage between the lowest threshold voltage and the highest threshold voltage is less than the reference value but the number of slow cells included in the memory block is greater than that of the first slow status slow_st1. The status information INFO_ST of the third memory block BLK3 may indicate the bad block BAD, which may indicate a memory block having a voltage difference between the lowest threshold voltage and the highest threshold voltage greater than the reference voltage. The status information INFO_ST of the fifth memory block BLK5 may indicate a first fast status fast_st1, which may mean a status in which the voltage difference between the lowest threshold voltage and the highest threshold voltage is less than the reference voltage but the number of fast cells that are included in the memory block are more than the slow cells. The status information INFO_ST of the sixth memory block BLK6 may indicate a second fast status fast_st2, which may mean a status in which the voltage difference between the lowest threshold voltage and the highest threshold voltage is less than the reference voltage but the number of fast cells included in the memory block is greater than that of the first fast status fast_st1.

The controller may perform the normal operations by referring to the status information INFO_ST of memory blocks stored in the status table 222. For example, the controller may set up the program, read, or erase operation using basic values set in the controller during the program, read, or erase operation with respect to the memory blocks in the normal status. With respect to the memory blocks in the slow status, the controller may manage an address so that the number of times the program and erase operations are performed is less than that of the memory blocks in the normal status. The controller may use the memory blocks in the fast status only in the SLC method.

Since the above-described test operation may be performed using the controller in a manufacturing step of the memory devices or may be performed using the controller also after packaging, the test operation of the present embodiment is not limited by a manufacturing step of the memory device or the memory system.

Figure 18:
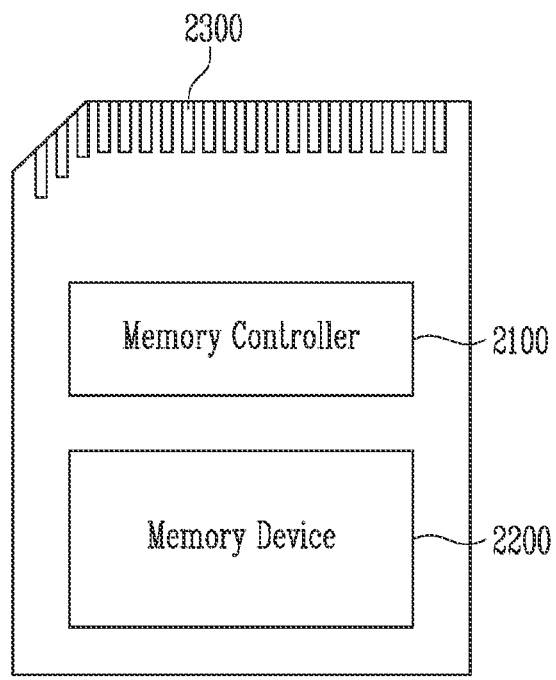
FIG. 18 is a diagram illustrating another embodiment of a memory system according to an embodiment of the present disclosure.

FIG. 18 is a diagram illustrating another embodiment of a memory system according to an embodiment of the present disclosure.

Referring to FIG. 18, a memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control a program, read, or erase operation of the memory device 2200, or control a background operation. The memory controller 2100 is configured to provide an interface between the memory device 2200 and the host. The memory controller 2100 is configured to drive firmware for controlling the memory device 2200. The memory device 2200 may be configured equally to the memory device 100 of FIG. 1 described with reference to FIG. 2.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. As an example, the connector 2300 may be defined by at least one of the various communication standards described above.

As an example, the memory device 2200 may be configured of various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque-magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 19:
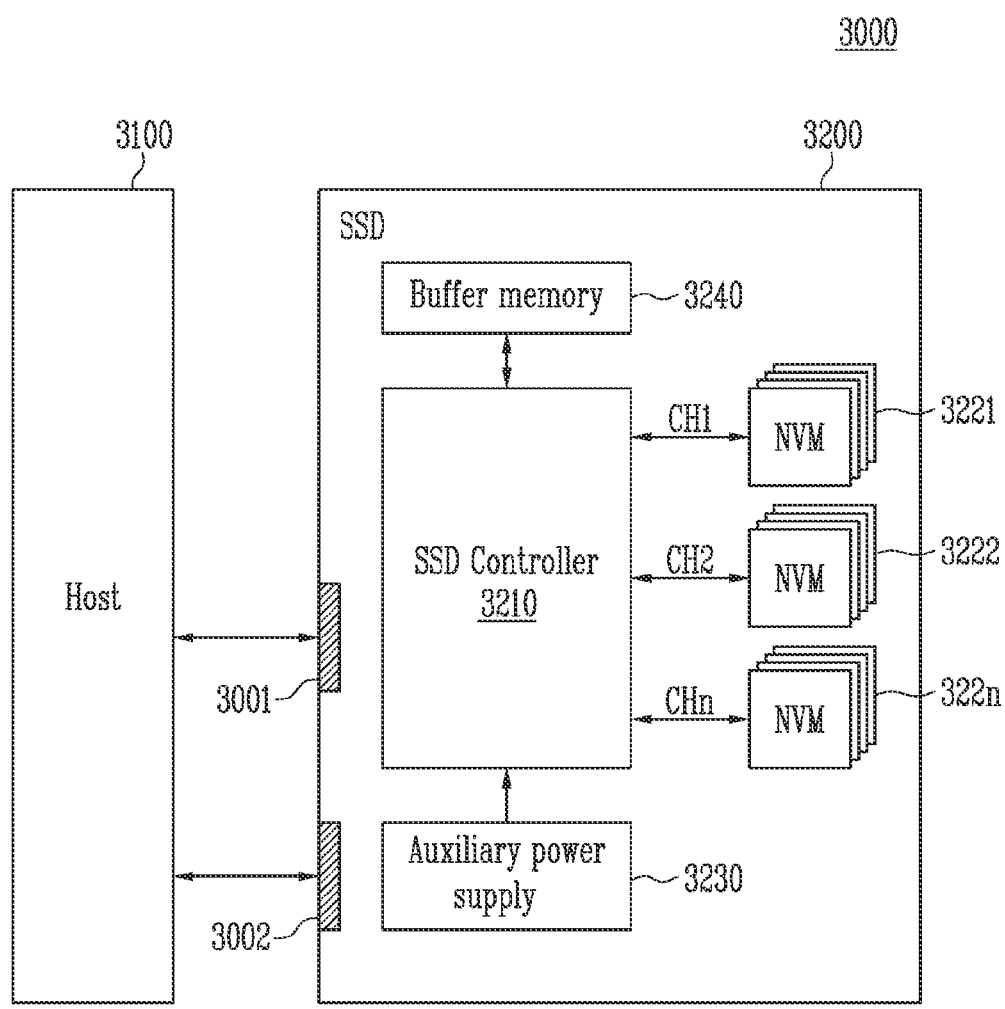
FIG. 19 is a diagram illustrating still another embodiment of a memory system according to an embodiment of the present disclosure.

FIG. 19 is a diagram illustrating still another embodiment of a memory system according to an embodiment of the present disclosure.

Referring to FIG. 19, an SSD system 3000 includes a host 3100 and an SSD 3200. The SSD 3200 exchanges a signal with the host 3100 through a signal connector 3001 and receives a power voltage through a power connector 3002. The SSD 3200 includes an SSD controller 3210, a plurality of flash memories 3221 to 322n, an auxiliary power supply 3230, and a buffer memory 3240.

According to an embodiment of the present disclosure, the flash memories 3221 to 322n may be configured equally to the memory device 1100 described with reference to FIG. 2.

The SSD controller 3210 may control the plurality of flash memories 3221 to 322n in response to the signal received from the host 3100. As an example, the signal may be signals based on an interface between the host 3100 and the SSD 3200. For example, the signal may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 3230 is connected to the host 3100 through the power connector 3002. The auxiliary power supply 3230 may receive the power from the host 3100 and may charge the power. The auxiliary power supply 3230 may provide power of the SSD 3200 when power supply from the host 3100 is not smooth. As an example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, and an LPDDR SDRAM, or a nonvolatile memory such as an FRAM, a ReRAM, an STT-MRAM, and a PRAM.

What is claimed is:

1. A controller comprising:
a test manager configured to output a program command for performing a program operation of a memory block and a suspend command for stopping the program operation; and
a memory interface configured to transmit the program command to a memory device including the memory block, and transmit the suspend command to the memory device after a set time elapses,
wherein the test manager outputs a read command for reading memory cells included in the memory block,
the memory interface calculates a count value by counting data output from the memory device in response to the read command, and
the test manager generates status information on the memory block according to the count value.

2. The controller of claim 1,
wherein the test manager is configured to output the program command of a first method for performing the program operation of the memory block,
wherein the memory interface is configured to transmit the program command to the memory device including the memory block, and
wherein the test manager outputs the read command of a second method for reading the memory cells included in the memory block.

3. The controller of claim 2, wherein the first method is different from the second method.

4. The controller of claim 2, wherein the test manager uses a single level cell method as the first method, and uses a triple level cell method as the second method.

5. The controller of claim 1, wherein the test manager is configured to output a termination command for terminating the suspended program operation suspended by the suspend command.

6. The controller of claim 5, wherein the memory interface is configured to sequentially transmit the program command, the suspend command, the termination command, and the read command to the memory device.

7. The controller of claim 1, wherein the memory interface is configured to output the suspend command to the memory device after a delay time elapses after outputting the program command.

8. The controller of claim 7, wherein the delay time is a time required to apply a program voltage to the memory cells a set number of times after the memory device starts the program operation in response to the program command.

9. The controller of claim 8, wherein the set number of times is one.

10. The controller of claim 1, wherein the memory interface is configured to transmit a first read command for detecting slow cells among the memory cells to the memory device and transmit a second read command for detecting fast cells among the memory cells to the memory device, when transmitting the read command to the memory device.

11. The controller of claim 10, wherein the memory interface is configured to receive first data output from the memory device in response to the first read command, calculate a first count value obtained by counting the number of logic low data included in the first data and a second count value obtained by counting the number of logic high data, and transmit the first and second count values to the test manager.

12. The controller of claim 11, wherein the test manager is configured to determine a status of the memory block as a slow status when the first count value is greater than a slow reference value and process the memory block as a bad block when the second count value is greater than a fast reference value.

13. The controller of claim 1, further comprising:
a buffer configured to store the status information output from the test manager.

14. The controller of claim 1, wherein the test manager is configured to generate a first sub read command for determining a slow status of the memory block by comparing the number of slow cells among the memory cells included in the memory block with a slow reference number when it is determined that the memory block is in the slow status, and generate a second sub read command for determining a fast status of the memory block by comparing the number of fast cells among the memory cells included in the memory block with a fast reference number when it is determined that the memory block is in the fast status.

15. The controller of claim 14, wherein the test manager is configured to determine the memory block as a bad block when it is determined that a voltage difference between a lowest threshold voltage and a highest threshold voltage of the memory cells is greater than a reference voltage.

16. The controller of claim 15, wherein the test manager is configured to generate the status information so that the status information indicates the slow status when the voltage difference is less than the reference voltage and the number of the slow cells that are included in the memory block is more than the number of the fast cells, and generate the status information so that the status information indicates the fast status when the voltage difference is less than the reference voltage and the number of the fast cells that are included in the memory block is more than the number of the slow cells.

17. A controller comprising:
a command generator configured to output a program command for performing a program operation of a memory block, a suspend command for stopping the program operation, a first read command for checking a slow status of the memory block, and a second read command for checking a fast status of the memory block;
a command queue configured to sequentially transmit the program command, the suspend command, the first read command, and the second read command to a memory device including the memory block;
a counter configured to receive first and second data output from the memory device in response to each of the first and second read commands, and output a count value by counting the number of different bits included in each of the first and second data; and
a status determiner configured to determine a status of the memory block according to the count value and generate status information.

18. The controller of claim 17, wherein the command queue is configured to output the suspend command to the memory device after a delay time after outputting the program command.

19. The controller of claim 18, wherein the delay time is a time required to apply a program voltage to memory cells a set number of times after the memory device starts the program operation in response to the program command.

20. The controller of claim 19, wherein the set number of times is one.

21. The controller of claim 18, wherein the command generator is configured to further output a termination command for terminating the program operation suspended by the suspend command.

22. The controller of claim 21, wherein the command queue is configured to output the termination command before outputting the first read command, after outputting the suspend command.

23. The controller of claim 17, wherein the counter is configured to count each of the numbers indicating a logic low value and a logic high value included in the first data received according to the first read command, transmit first count values calculated as a count result to the status determiner, count each of the numbers indicating a logic low value and a logic high value included in the second data received according to the second read command, and transmit second count values calculated as a count result to the status determiner.

24. The controller of claim 23, wherein the status determiner is configured to determine the status of the memory block as a slow status when a value corresponding to slow cells among the first count values is greater than a slow reference value and process the memory block as a bad block when a value corresponding to fast cells among the second count values is greater than a fast reference value.

* * * * *